(12) United States Patent
Wieczorek et al.

(10) Patent No.: US 6,723,663 B1
(45) Date of Patent: Apr. 20, 2004

(54) TECHNIQUE FOR FORMING AN OXIDE/NITRIDE LAYER STACK BY CONTROLLING THE NITROGEN ION CONCENTRATION IN A NITRIDATION PLASMA

(75) Inventors: Karsten Wieczorek, Dresden (DE); Falk Graetsch, Dresden (DE); Lutz Herrmann, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/443,642

(22) Filed: May 22, 2003

(30) Foreign Application Priority Data

Nov. 29, 2002 (DE) .......................... 102 55 936

(51) Int. Cl.[7] .................. H01L 21/31; H01L 21/469
(52) U.S. Cl. .................. 438/776; 438/763; 438/769
(58) Field of Search .................. 438/763, 769, 438/776, 795

(56) References Cited

U.S. PATENT DOCUMENTS

| | | | |
|---|---|---|---|
| 6,114,258 A | * 9/2000 | Miner et al. | 438/787 |
| 6,303,520 B1 | * 10/2001 | Kwong et al. | 438/769 |
| 6,498,383 B2 | * 12/2002 | Beyer et al. | 257/510 |
| 6,576,967 B1 | * 6/2003 | Schaeffer et al. | 257/411 |
| 6,632,747 B2 | * 10/2003 | Niimi et al. | 438/775 |
| 6,660,659 B1 | * 12/2003 | Kraus et al. | 438/776 |
| 2003/0224616 A1 | * 12/2003 | Ogawa et al. | 438/762 |

* cited by examiner

Primary Examiner—Alexander Ghyka
(74) Attorney, Agent, or Firm—Williams, Morgan & Amerson, P.C.

(57) ABSTRACT

For aggressively scaled field effect transistors, nitrogen is incorporated into a base oxide layer, wherein, at an initial phase of a plasma nitridation process, the nitrogen ion density is maintained at a value so that incorporation of nitrogen into the channel region is minimized. Subsequently, when the thickness of the base oxide layer has increased, due to residual oxygen in the plasma ambient, the nitrogen ion density is increased, thereby increasing the nitridation rate. Preferably, the nitrogen ion density is controlled by varying the pressure of the plasma ambient. Moreover, a system is disclosed that allows control of the nitridation rate in response to an oxide layer thickness.

23 Claims, 4 Drawing Sheets

TECHNIQUE FOR FORMING AN OXIDE/ NITRIDE LAYER STACK BY CONTROLLING THE NITROGEN ION CONCENTRATION IN A NITRIDATION PLASMA

BACKGROUND OF THE INVENTION

1. Field of the Invention

Generally, the present invention relates to the field of fabricating microstructures, such as integrated circuits, micromechanical structures and the like, and, more particularly, to the formation of an ultra-thin dielectric oxide layer having increased resistance against migration of charge carriers through the dielectric oxide layer.

2. Description of the Related Art

Presently, microstructures are integrated into a wide variety of products. One example in this respect is the employment of integrated circuits that, due to their relatively low cost and high performance, are increasingly used in many types of devices, thereby allowing superior control and operation of those devices. Due to economic reasons, manufacturers of microstructures, such as integrated circuits, are confronted with the task of steadily improving performance of these microstructures with every new generation appearing on the market. However, these economic constraints not only require improving the device performance but also demand a reduction in size so as to provide more functionality of the integrated circuit per unit chip area. Thus, in the semiconductor industry, ongoing efforts are being made to reduce the feature sizes of feature elements. In present-day technologies, the critical dimension of these elements approach 0.1 $\mu$m and less. In producing circuit elements of this order of magnitude, along with many other issues especially arising from the reduction of feature sizes, process engineers face several issues. For example, one such issue involves providing extremely thin dielectric layers on an underlying material layer, wherein certain characteristics of the dielectric layer, such as permittivity and/or resistance against charge carrier tunneling and the like, have to be improved without sacrificing the physical properties of the underlying material layer.

One important example in this respect is the formation of ultra-thin gate insulation layers of field effect transistors, such as MOS transistors. The gate dielectric of a transistor has an essential impact on the performance of the transistor. As is commonly known, reducing the size of a field effect transistor, that is reducing the length of a conductive channel that forms in a portion of a semiconductor region by applying a control voltage to a gate electrode formed on the gate insulation layer, also requires the reduction of the thickness of the gate insulation layer to maintain the required capacitive coupling from the gate electrode to the channel region. Currently, most of the highly sophisticated integrated circuits, such as CPUs, memory chips and the like, are based on silicon and, therefore, silicon dioxide has preferably been used as the material for the gate insulation layer due to the well-known and superior characteristics of the silicon dioxide/silicon interface. For a channel length on the order of 100 nm and less, however, the thickness of the gate insulation layer has to be reduced to about 2 nm in order to maintain the required controllability of the transistor operation. Steadily decreasing the thickness of the silicon dioxide gate insulation layer, however, leads to an increased leakage current therethrough, thereby resulting in an unacceptable increase of static power consumption as the leakage current exponentially increases for a linear reduction of the layer thickness.

Therefore, great efforts are presently being made to replace silicon dioxide by a dielectric exhibiting a higher permittivity so that a thickness thereof may be higher than the thickness of a corresponding silicon dioxide layer providing the same capacitive coupling. A thickness for obtaining a specified capacitive coupling will also be referred to as capacitive equivalent thickness and determines the thickness that would be required for a silicon dioxide layer. It turns out, however, that it is difficult to incorporate high-k materials into the conventional integration process and, more importantly, the provision of a high-k material as a gate insulation layer seems to have a significant influence on the carrier mobility in the underlying channel region, thereby remarkably reducing the carrier mobility and thus the drive current capability. Hence, although an improvement of the static transistor characteristics may be obtained by providing a thick high-k material, at the same time, an unacceptable degradation of the dynamic behavior presently makes this approach less than desirable.

A different approach that is currently favored is the employment of an integrated silicon oxide/nitride layer stack that may reduce the gate leakage current by 0.5 to 2 orders of magnitude while maintaining compatibility with standard CMOS process techniques. It has been found that the reduction of the gate leakage current mainly depends upon the nitrogen concentration incorporated into the silicon dioxide layer by means of plasma nitridation. Although this approach seems to relax the issue of gate dielectric leakage for the present circuit generation, this approach does not seem to allow further aggressive dielectric thickness scaling required for future device generations. To more clearly demonstrate the problems involved in the conventional process technique, a typical process flow for forming a gate insulation layer, including a nitride/silicon dioxide layer, will now be described with reference to FIGS. 1a–1e.

In FIG. 1a, a semiconductor device 100 comprises a silicon substrate 101, in which an active region 103 is defined by shallow trench isolations 102. A thin dielectric base layer 110, for example formed of a grown oxide layer, covers the active region 103. Moreover, the semiconductor device 100 is exposed to a nitrogen-containing plasma, indicated by reference sign 104.

Typically, the semiconductor device 100 may be formed according to the following process sequence. After formation of the shallow trench isolation 102 and various implantation steps to generate a required well dopant profile (not shown) in the active region 103, the dielectric base layer 110 is formed by a conventional oxidation process or by a rapid thermal oxidation process. Subsequently, the semiconductor device 100 is exposed to the nitrogen-containing plasma 104 to introduce nitrogen ions into the silicon dioxide layer 110 to improve, as explained above, the resistance of the dielectric base layer 110 against charge carrier migration and to increase the permittivity thereof. An energy of the ions in the nitrogen-containing plasma 104 is substantially determined by the difference between the plasma potential and the floating potential of the semiconductor device 100, wherein this voltage is difficult to adjust or even may not be adjustable at all. The ion density and, thus, the nitridation rate depends on process parameters, such as the high frequency (HF) power, the temperature of the plasma ambient 104, the pressure thereof, and the like.

As is well known, nitrogen atoms, introduced into the active region 103 and thus into the channel region of the transistor device to be formed, significantly affect the electrical characteristics of the transistor device in that both the crystallinity of the active region 103 is deteriorated and the charge carrier mobility is degraded. Consequently, the introduction of nitrogen into the active region 103 has to be suppressed as much as possible in view of a required high transistor performance. On the other hand, a thickness of the dielectric base layer 110 is to be scaled down in conformity with the device dimensions which would, however, at a certain minimum dielectric thickness, lead to an increased penetration of nitrogen ions into the active region 103 during the plasma treating 104. As a consequence, there exists a severe trade-off between the improvement of the transistor device performance by scaling down the dielectric base layer 110 and the device degradation caused by the incorporation of nitrogen into the active region 103. FIGS. 1b and 1c will more clearly illustrate this situation.

In FIG. 1b, on the left-hand side, a cut-out of FIG. 1a is schematically illustrated in a magnified view, in which the dielectric base layer 110 includes nitrogen atoms according to a concentration profile 112 along a depth direction 111. As is evident from FIG. 1b, a thickness 113 of the dielectric base layer 110 is selected so that a penetration of nitrogen into the underlying active region 103 is minimal. The right-hand side of FIG. 1b depicts a graph, wherein the concentration profile 112 is plotted versus the depth direction 111. As can be seen from this graph, the nitrogen concentration drops to a very low value, which in the present illustration is idealized as 0, within the thickness 113 of the base layer 110, thereby substantially avoiding any device degradation caused by the reduction of carrier mobility. FIG. 1b represents the situation when the design thickness 113 is in conformity with a desired channel length and suffices to still allow a substantial blocking of the nitrogen.

FIG. 1c, on the other hand, illustrates the situation when a thickness 113' of the base layer 110 has to be reduced in conformity with design rules compared to that of FIG. 1b and, therefore, the concentration profile 112 reaches down into the active area 103. The right-hand side of FIG. 1c shows a resulting nitrogen concentration 112 with respect to the depth direction 111 and clearly reveals that a significant amount of nitrogen is in the active region 103, to thereby negatively affect the carrier mobility.

FIG. 1d schematically shows the semiconductor device 100 in an advanced manufacturing stage. Drain and source regions 107 are formed within the active region 103 and a gate electrode 106 is formed on the patterned dielectric base layer 110, which is now indicated as 110a, wherein the gate insulation layer 110a has the thickness 113 and a nitrogen concentration profile 112 as shown in FIG. 1b. Moreover, sidewall spacers 105 are formed adjacent to the gate electrode 106.

Typical process steps for forming the semiconductor device 100, as shown in FIG. 1d, include well-known advanced photolithography and etch techniques, as well as implantation steps, and thus a detailed description thereof will be omitted.

FIG. 1e, on the other hand, schematically depicts the semiconductor device 100 having the gate insulation layer 110a with the reduced thickness 113' as shown in FIG. 1c, so that a corresponding residual nitrogen concentration is present within the drain and source regions 107 and the relevant portion of the active region 103.

As a consequence, the prior art processing described above allows a scaling of the thickness 113 of the gate insulation layer 110a to a value that substantially prevents penetration of nitrogen into the active region 103, thereby obtaining improved device performance. However, when design requirements demand a further scaling of the thickness 113 to conform to the corresponding transistor dimensions, i.e., when the design capacitive equivalent thickness requires the thickness 113', an unacceptable amount of nitrogen is introduced into the surface portion of the active region 103 so that the reduced carrier mobility may result in a device performance degradation.

In view of the problems explained above, it is thus highly desirable to provide a technique allowing for improvement of the resistance of an oxide/nitride layer stack against migration of charge carriers therethrough without unduly negatively affecting the physical characteristics of an underlying material layer, such as the carrier mobility of a silicon layer.

SUMMARY OF THE INVENTION

The present invention is based on the finding that the nitrogen concentration introduced into a material layer underlying an oxide layer that is to be doped to improve with respect to permittivity and resistance against a charge carrier tunneling may effectively be reduced in that the nitrogen ion concentration during a plasma nitridation is controlled such that at an initial phase of the process a low ion density is established. During the further progression of the process, the thickness of the oxide layer may increase due to the further oxidation and/or deposition of residual oxygen and the nitrogen ion density is then increased so as to incorporate a required amount of nitrogen into the oxide layer. Especially the pressure during the plasma nitridation may be selected for controlling the nitrogen ion density in the plasma ambient.

According to one illustrative embodiment of the present invention, a method of forming an insulation layer includes the formation of an oxide base layer on a substrate. The substrate is then introduced into a nitrogen-containing plasma ambient of controlled pressure, wherein the pressure is reduced during exposure of the substrate to the nitrogen-containing plasma ambient.

According to another illustrative embodiment of the present invention, a method of forming an insulation layer comprises forming an oxide layer with a first thickness on a semiconductor region and oxidizing the semiconductor region in a nitrogen-containing plasma ambient by oxygen residuals that are present in the nitrogen-containing plasma ambient. Moreover, a nitrogen ion density is increased while the semiconductor region is oxidized.

According to still a further illustrative embodiment of the present invention, a method of forming a gate insulation layer comprises forming a base oxide layer on an active region with a thickness that is less than a predefined design thickness of the gate insulation layer. The substrate is then introduced in a nitrogen-containing plasma ambient of controlled pressure, wherein the pressure is reduced during the exposure of the substrate to the plasma ambient while simultaneously the thickness of the base oxide layer is increased by residual oxygen in the plasma ambient.

Pursuant to yet another illustrative embodiment of the present invention, a method of controlling a nitrogen concentration during the formation of an insulation layer is provided. The method includes the exposure of a substrate to a nitrogen-containing plasma ambient, wherein the substrate has formed thereon an oxide layer of a predefined thickness. The thickness of the oxide layer is then monitored and a monitor signal is generated that indicates the monitored thickness. Additionally, at least one process parameter determining a nitrogen ion density in the plasma ambient is controlled on the basis of the monitor signal.

In a further illustrative embodiment of the present invention, a system for forming an insulation layer comprises a process chamber and a plasma generator arranged therein. Moreover, a controllable vacuum generator is provided and is configured to adjust a pressure in the process chamber. Moreover, a thickness measurement tool is provided that is configured to determine the thickness of a layer formed above a substrate positioned within the process chamber. Finally, a control unit is connected to the controllable vacuum generator and the thickness measurement tool and is, furthermore, adapted to receive a monitor signal from the thickness measurement tool and to control the vacuum generator on the basis of the received monitor signal.

BRIEF DESCRIPTION OF THE DRAWINGS

The invention may be understood by reference to the following description taken in conjunction with the accompanying drawings, in which like reference numerals identify like elements, and in which.

Figure 1A:
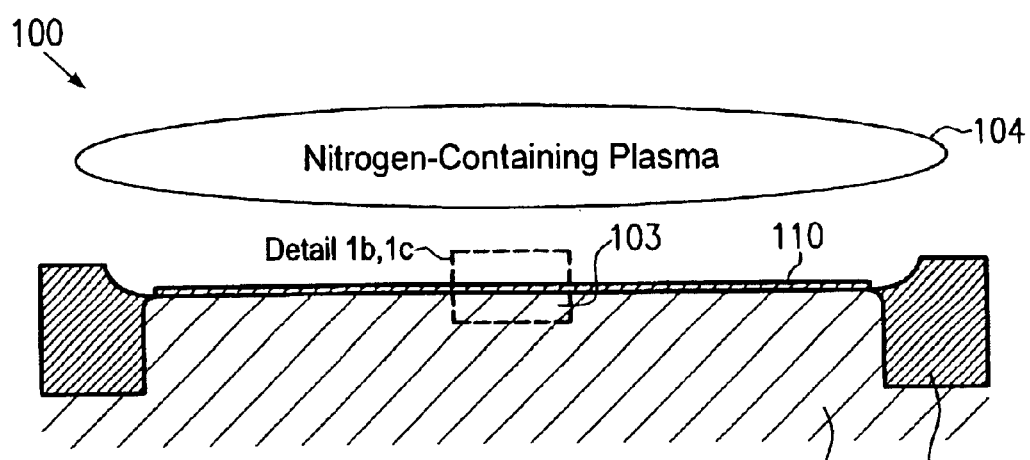
FIGS. 1a–1e schematically show a conventional transistor structure during various manufacturing stages and corresponding nitrogen profiles in a gate insulation layer.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In the following illustrative embodiments, reference will be made to the formation of a gate insulation layer of a field effect transistor. The application of the principles of the present invention to extremely scale gate insulation layers exhibiting reduced leakage and enhanced permittivity should, however, not be considered as limiting. Rather, the formation of very thin dielectric layers are or may become relevant in a plurality of applications, such as memory devices, the dielectric of capacitors, as are frequently used as decoupling capacitors in CMOS devices, in opto-electronic microstructures, in micromechanical structures in the field of nanotechnology, and the like.

As previously noted, plasma nitridation is typically used to form ultra thin gate insulation layers, since significantly higher nitrogen concentrations can be obtained compared to conventional furnace processing. Plasma nitridation is carried out in conventional processes at a relatively low pressure to obtain high ion concentrations, while at the same time ensuring a good control of the oxide layer thickness, since the relatively short process time minimizes the amount of residual and unavoidable oxygen that is incorporated into the oxide layer so that the layer thickness is only insignificantly increased during the plasma treatment. The low pressure, and thus the relatively high ion concentration in the plasma ambient, however, entails a severe limitation for the conventional process flow when the oxide layer thickness is reduced to the thickness required for advanced integrated circuit products, e.g., less than approximately 0.5–3 nm, since an unacceptable amount of nitrogen is incorporated into the underlying channel region, as is explained with reference to FIG. 1b.

The present invention takes advantage of the fact that the nitrogen ion density is strongly related to the process pressure of the plasma ambient and therefore the flux of nitrogen ions incorporated into an oxide layer can be controlled by varying the process pressure for appropriately chosen other process parameters, such as plasma power, temperature, and the like.

Figure 2A:
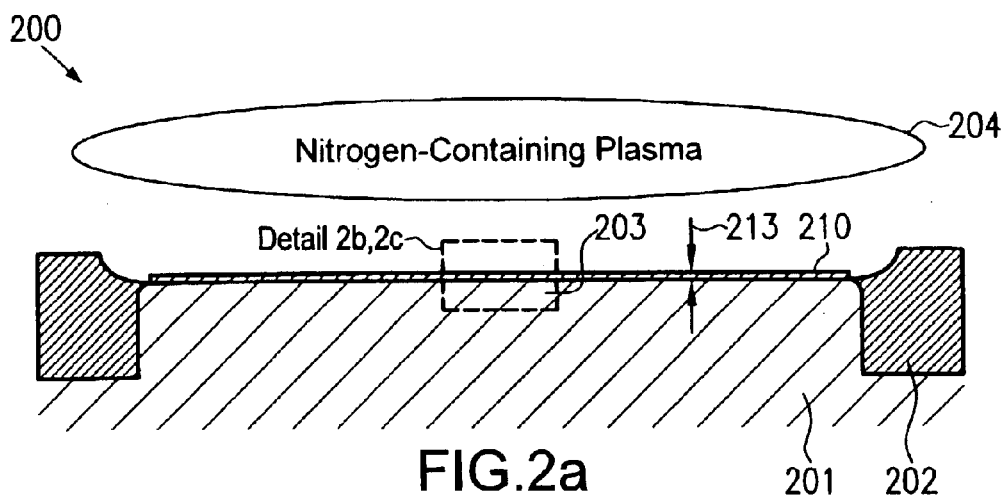
FIGS. 2a–2c schematically show a transistor structure and respective nitrogen profiles thereof during various manufacturing stages according to one illustrative embodiment of the present invention.

Further illustrative embodiments of the present invention will now be described with reference to FIGS. 2a–2c and 3. In FIG. 2a, a semiconductor device 200 comprises a substrate 201 having formed thereon an active semiconductor region 203 that may additionally comprise a specified dopant distribution to provide for the required transistor characteristics for the field effect transistor to be formed. Since the present invention is especially advantageous when applied to silicon-based CMOS processes, the substrate 201 may be considered as any appropriate substrate for bearing a silicon-containing layer that substantially comprises the active region 203. It should nevertheless be appreciated that the active region 203 may comprise other materials, for example, germanium and the like required for adjusting the desired physical characteristics of the active region 203. The active region 203 is enclosed by an isolation structure 202, such as a shallow trench isolation usually employed in highly sophisticated semiconductor devices. A dielectric oxide layer 210 is formed on the active region 203 with a first thickness 213 that is deliberately chosen to be substantially less than a desired design thickness of the gate insulation layer to be formed. In some embodiments, the first thickness 213 is approximately 0.5–2 nm less than the desired target thickness.

In one particular embodiment, the dielectric oxide layer is substantially comprised of silicon dioxide and the active region 203 comprises silicon. The thickness 213 may be in the range of approximately 1–10 nm and in particular embodiments relating to extremely scaled transistor devices, the thickness 213 may be less than 1 nm.

Figure 1B:
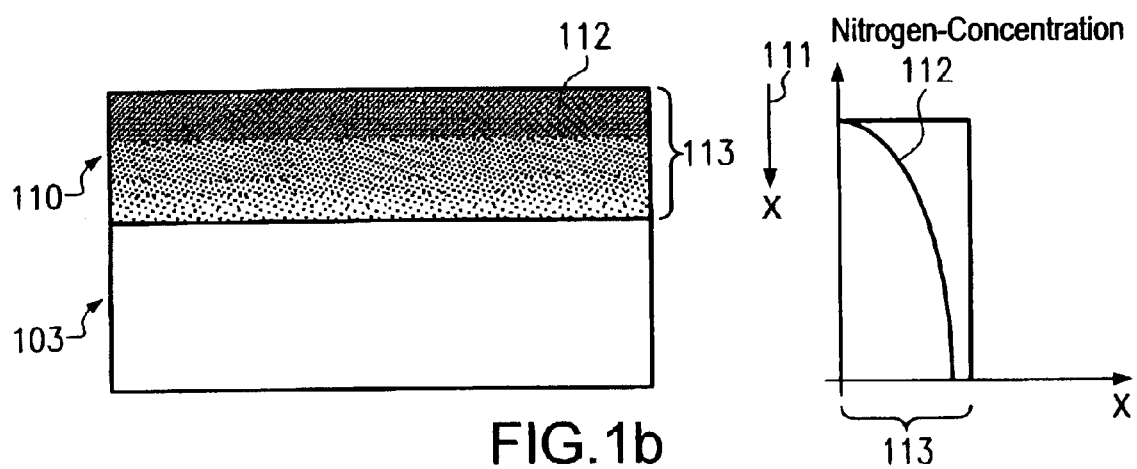
Figure 1C:
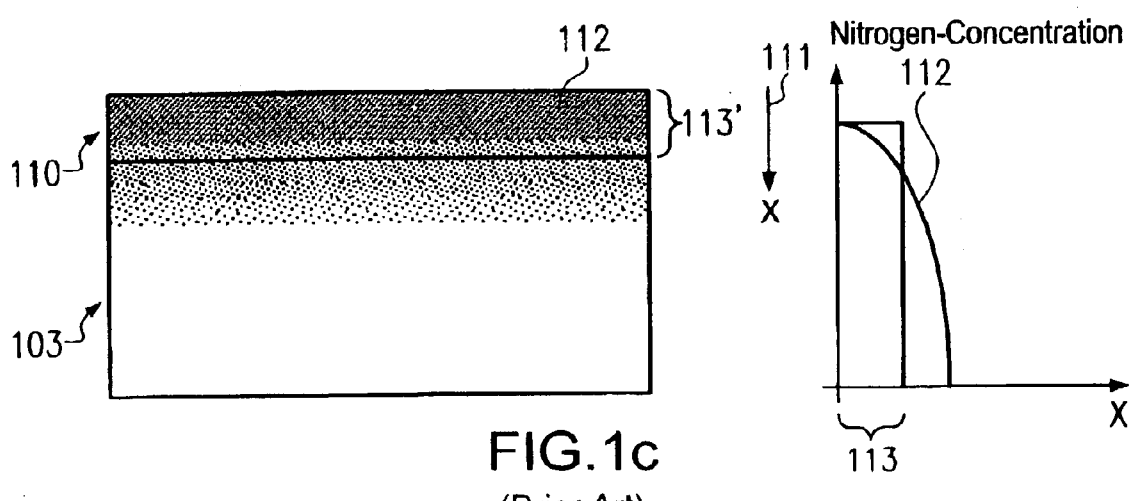

Regarding the formation of the semiconductor structure 200 as shown in FIG. 2a, substantially the same process steps as already described with reference to FIG. 1a may be employed. In particular, the dielectric oxide layer 210 may be formed by conventional growth processes, such as a high temperature furnace growth or by a rapid thermal oxidation process. In other embodiments, the dielectric oxide layer 210 may be deposited by using sophisticated deposition methods, such as chemical vapor deposition method of atomic monolayers and the like. The dielectric oxide layer 210 may also be formed from $HCl/H_2O_2$ in the cleaning process.

Subsequently, the substrate 201 is introduced into a nitrogen-containing plasma ambient 204, wherein at least one process parameter is controlled to adjust a nitrogen ion density within the plasma ambient 204 to a required level. For instance, a high frequency power required to establish the plasma ambient 204 and the temperature thereof may be selected and the pressure of the plasma ambient 204 is then controlled to adjust the ion density. Since the pressure of the plasma ambient 204 is precisely and reproducibly adjustable by corresponding equipped vacuum sources, as will be described in more detail with reference to FIG. 3, an appropriate nitrogen ion concentration may be established in the plasma ambient 204 in a reliable and rapid fashion. Accordingly, the nitridation rate is precisely controllable and, thus, the amount of nitrogen ions incorporated into the dielectric base layer 210 may be controlled so as to minimize the number of nitrogen atoms penetrating the active region 203. To this end, the pressure in the plasma ambient 204 is, depending on the further process parameters, such as high frequency power and temperature in the plasma ambient, adjusted to a relatively high level so that the corresponding nitridation rate is relatively low. For example, for an effective high frequency power in the range of approximately 50–500 watts and a temperature in the range of approximately 60–500° C., an initial pressure is set to a range of approximately 10 mTorr to 1 Torr when the thickness 213 is about 1 nm or less. While the substrate 201 is exposed to the plasma ambient 204, additionally, residual oxygen ions are incorporated into the dielectric oxide layer 210, thereby continuously increasing the thickness 213.

Figure 2B:
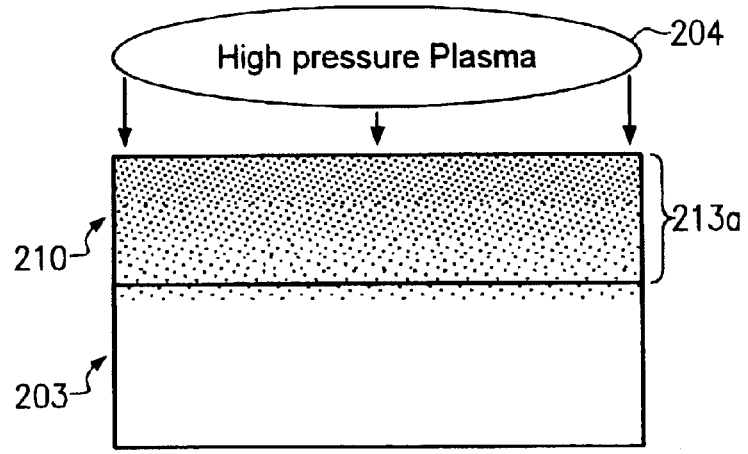

FIG. 2b schematically shows a magnified view of the dielectric oxide layer 210 at an initial phase of the plasma treatment. The nitrogen concentration is substantially confined to the dielectric oxide layer 210 with only a minimal amount of nitrogen within the active region 203. Meanwhile, the additional incorporation of oxygen has resulted in an increased thickness 213a.

Once the thickness 213a has reached a specified value, the pressure in the plasma ambient 204 may be decreased so as to increase the nitrogen ion density and hence the nitridation rate. In this way, the currently prevailing nitridation rate may be appropriately adapted to the current thickness 213a so that the amount of nitrogen penetrating the active region 203 is maintained at an allowable low level. In one embodiment, the high pressure is maintained until the required final thickness of the dielectric oxide layer 210 is obtained, and, in a subsequent step, the pressure is increased to a value as used in the conventional process flow to obtain a high nitridation rate. The second step of low pressure in the plasma ambient 204 may, however, be significantly shorter compared to the conventional approach as a significant amount of nitrogen has already been incorporated into the dielectric oxide layer 210. In other embodiments, the pressure of the plasma ambient 204 may be decreased stepwise for a plurality of steps, whenever the thickness 213a reaches a predefined threshold value. In still other embodiments, the pressure may be substantially continuously adjusted depending on the current thickness 213a.

Irrespective of the manner of how the pressure is controlled, a substantially graded nitrogen concentration is obtained in the dielectric oxide layer 210, with a minimum amount of nitrogen in the active region 203.

Figure 2C:
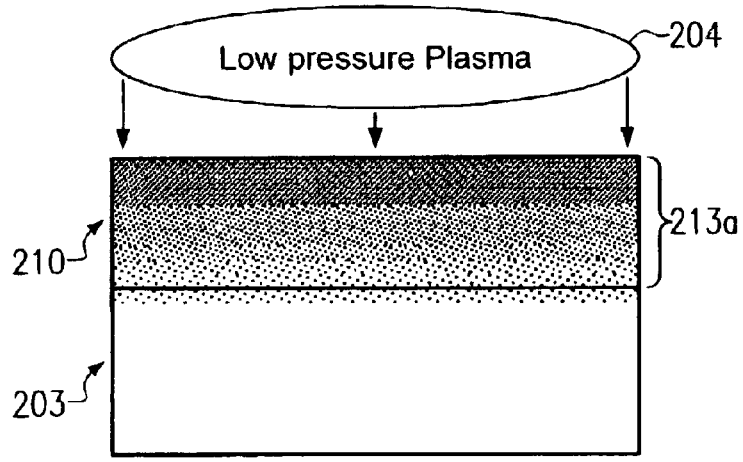

FIG. 2c schematically shows a magnified view of dielectric oxide layer 210 at a final phase of the plasma treatment, when the plasma ambient 204 is maintained at a low pressure. The thickness 213a has reached the desired final design thickness, wherein now a required amount of nitrogen is incorporated into the dielectric oxide layer 210 so that the permittivity thereof is significantly increased while the resistance against charge carrier tunneling is also increased.

Figure 1D:
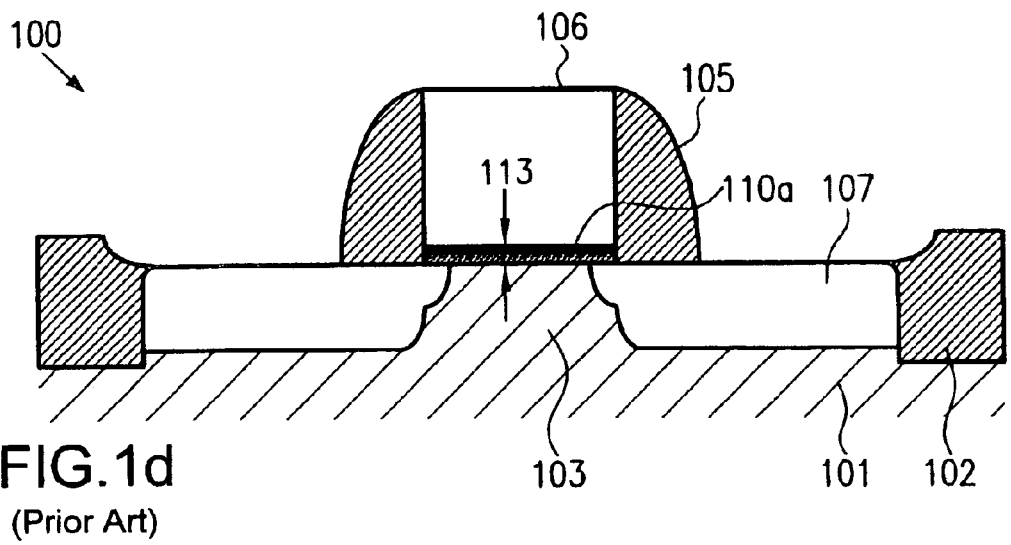
Figure 1E:
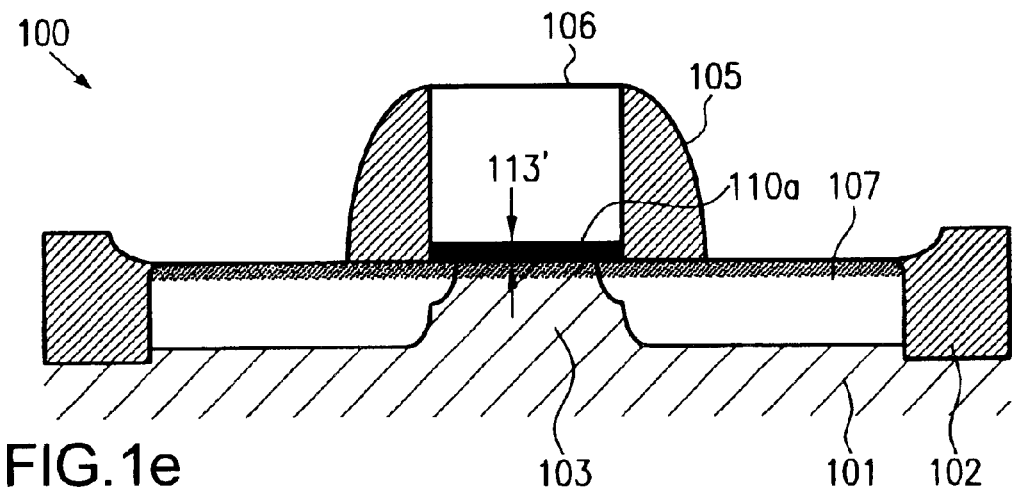

The substrate 201 may then further be processed to finally obtain a field effect transistor, wherein similar process steps may be carried out as previously described with reference to FIG. 1d or 1e.

Figure 3:
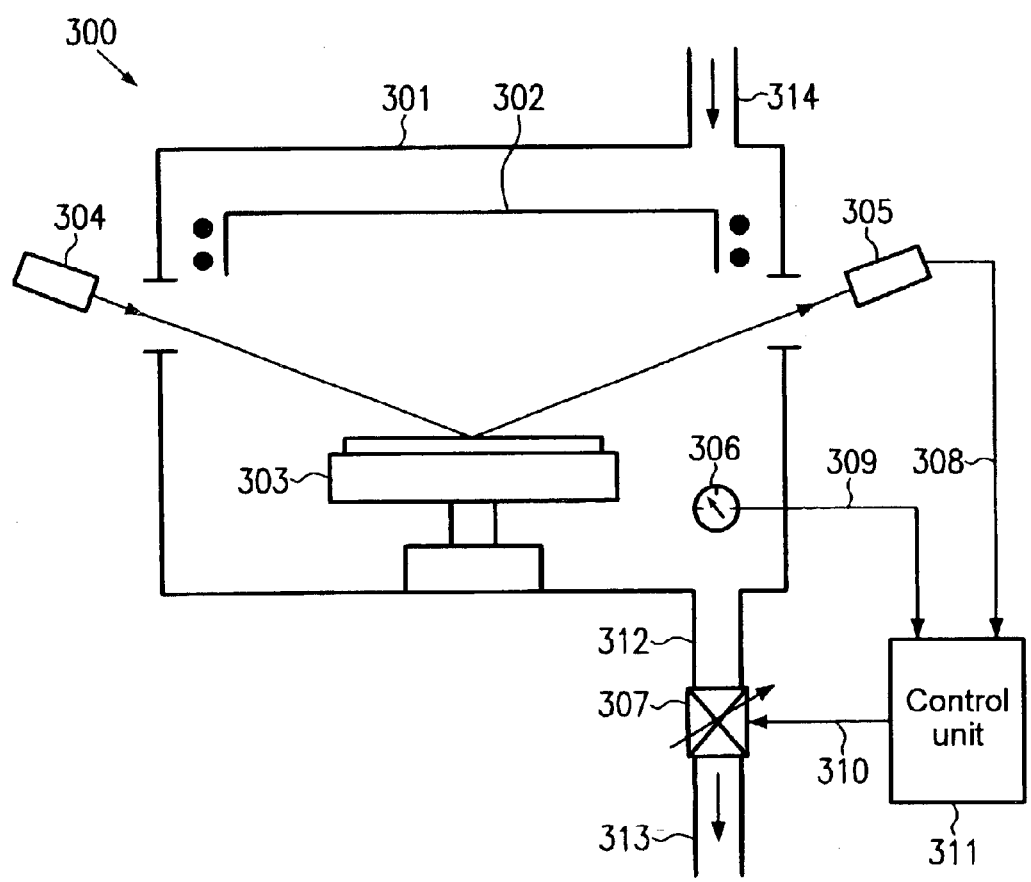
FIG. 3 schematically illustrates a system for forming an oxide/nitride layer in accordance with a further illustrative embodiment of the present invention.

FIG. 3 schematically shows a system that is appropriate for carrying out the above-described process sequences. A system 300 comprises a process chamber 301 including a plasma generator 302 configured to excite a plasma upon application of an appropriate high frequency, low frequency and bias power. For convenience, any means for producing and supplying power to the plasma generator 302 are not shown in FIG. 3. The process chamber 301 further comprises a substrate holder 303 adapted to receive and hold in place a substrate, such as the substrate 201. An inlet 314 is connected to a source of precursor gases (not shown), such as nitrogen and the like. Furthermore, an outlet 312 is connected to a controllable vacuum source, in the present example the controllable vacuum source is represented by a controllable valve element 307 arranged within a vacuum pipe 313. It should be appreciated, however, that any appropriate means for establishing a negative pressure within the process chamber 301 with the required accuracy, such as rotary pumps and the like, with or without additional valve elements, may be appropriate. Moreover, one or more sensor elements, for example, a pressure sensor 306, may be provided and may be adapted to generate a sensor signal 309 indicative of the physical quantity measured by the sensor element 306. The system 300 further comprises a thickness measurement tool, in the present example, represented by a light source 304 and a light detector 305 appropriately arranged to emit a light beam to and receive the reflected light beam from the substrate holder 303, respectively. The light source 304 and the detector 305 are configured to allow the measurement of a material layer with a required accuracy. For example, the light source 304 and the detector 305 may be configured similarly to an ellipsometer as usually used for thickness measurement in semiconductor production lines. The detector 305 is therefore configured to output a monitor signal 308 indicative of the thickness of a layer to be measured. The controllable valve element 307, the detector 305 and the sensor element 306 are operatively coupled to a control unit 311, which is configured to output a control signal 310 to the valve element 307 on the basis of the monitor signal 308 and the sensor signal 309. As will be appreciated, the control unit 311 may be implemented in a general purpose computer, in a control unit that operates the thickness measurement tool 304, 305 or the process chamber 301, or the control unit may be connected to or implemented into a facility management system.

In operation, the substrate 201 having formed thereon the dielectric layer 210 with the specified thickness 213 is loaded on the substrate holder 303. The plasma ambient 204 is established upon application of an appropriate power to the plasma generator 302, while the pressure is controlled by the control unit 311 via the valve element 307. For instance, the thickness 213 may be verified by the detector 305 and the control unit 311 may then determine an appropriate pressure and, thus, an appropriate nitridation rate for an initial phase of the plasma treatment. A corresponding relationship between the thickness 213 and the required pressure within the process chamber 301 may be established on the basis of test runs and/or calculations on the basis of the model of the plasma treatment. Due to residual oxygen in the process chamber 301 during a plasma treatment, the thickness 213 continuously increases. Since the thickness is monitored by the detector 305, minor variations of the oxygen concentration within the process chamber 301 during the processing of a plurality of substrates may be compensated for by correspondingly adjusting the pressure in accordance with the "growth" rate of the dielectric oxide layer 210. Thus, the required final design thickness may reliably be obtained irrespective of oxygen concentration fluctuations.

Since the nitridation rate is strongly related to the pressure within the process chamber 301, the control unit 311 may further determine the amount of nitrogen incorporated into the dielectric oxide layer 210 by monitoring the process time and the chamber pressure. Thus, in order to obtain the required characteristics in view of leakage, barrier properties and permittivity, the control unit 311 may not only adjust the chamber pressure so as to minimize the amount of nitrogen incorporated into the active region 203 but also to introduce substantially the same amount of nitrogen into the dielectric oxide layer 210 for a plurality of successively processed substrates irrespective of slight oxygen and thus growth rate, variations.

For example, when a two step process is employed, the control unit 311 may determine the amount of nitrogen incorporated into the dielectric layer 210 at the high pressure phase and may then, after the required final thickness 213 is obtained, adjust the pressure to a sufficiently low value so that the required total amount of nitrogen is incorporated without exceeding the specified final thickness for the dielectric oxide layer 210. In other embodiments, a plurality of threshold values for the thickness 213 may be defined and the control unit 311 may determine a required pressure value for each of the predefined intermediate thickness values. For example, a corresponding designation may be implemented as look-up tables, or may be determined during run-time. Additionally, the amount of nitrogen incorporated into the dielectric oxide layer may be taken into account for establishing a suitable pressure. In other embodiments, the pressure may be substantially continuously controlled and adjusted to the current thickness and the amount of nitrogen already incorporated and still to be incorporated.

The pressure adjustment as described above may depend on further parameters, such as plasma temperature, HF power, bias power, bias voltage, chamber dimensions, and the like. Thus, the influence of the parameters may be considered when establishing a corresponding relationship between the current thickness 213 and the chamber pressure.

Thus, the system 300 allows the reliable and reproducible incorporation of nitrogen into a dielectric oxide layer, without unduly affecting the physical properties of the material provided below the dielectric oxide layer. Therefore, gate insulation layers may be manufactured having a physical thickness well beyond 2 nm.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming an insulation layer, the method comprising:
   forming a dielectric oxide layer on a substrate; and
   introducing said substrate into a nitrogen-containing plasma ambient having a controlled pressure,
   wherein said pressure is reduced during the exposure of said substrate to said nitrogen-containing plasma ambient.

2. The method of claim 1, wherein said pressure is reduced in a step-wise manner.

3. The method of claim 2, wherein, in an initial step, said pressure is selected on the basis of an initial thickness of said dielectric oxide layer so as to maintain the amount of nitrogen incorporated into said substrate at a specified level.

4. The method of claim 1, wherein said pressure is reduced in a substantially continuous manner.

5. The method of claim 1, wherein a thickness of said dielectric oxide layer is approximately 1 nm or less.

6. The method of claim 1, wherein forming said dielectric oxide layer includes at least one of a furnace process, a rapid thermal oxidation and a deposition process.

7. The method of claim 1, wherein the pressure reduction is controlled on the basis of the thickness of said dielectric oxide layer during exposure to said plasma ambient.

8. The method of claim 1, further comprising:
   forming a doped active region in said substrate prior to forming said dielectric oxide layer; and
   forming a field effect transistor in and on said doped active region, wherein said insulation layer is patterned as a gate insulation layer.

9. The method of claim 1, wherein a thickness of said dielectric oxide layer prior to introducing said substrate into said plasma ambient is approximately 1 nm or less.

10. A method of forming an insulation layer, the method comprising:
    forming a silicon dioxide layer with a first thickness on a silicon-containing semiconductor region provided on a substrate;

oxidizing said silicon-containing semiconductor region in a nitrogen-containing plasma ambient by oxygen residuals present in said plasma ambient to increase said first thickness to a second thickness; and increasing the nitrogen ion concentration in said plasma ambient when said second thickness substantially corresponds to a threshold value.

11. The method of claim 10, wherein increasing said nitrogen ion concentration includes decreasing a pressure of said plasma ambient.

12. The method of claim 10, wherein said first thickness is approximately 1 nm or less.

13. A method of forming a gate insulation layer of a field effect transistor, the method comprising:

forming a dielectric oxide layer with an initial thickness on an active region formed on a substrate, said initial thickness being less than a desired design thickness of said gate insulation layer;

introducing said substrate into a nitrogen-containing plasma ambient of controlled pressure; and reducing said pressure during exposure of said substrate to said plasma ambient.

14. The method of claim 13, wherein said design thickness is in the range of approximately 1–2 nm.

15. The method of claim 13, wherein the pressure is reduced in a substantially step-wise manner.

16. The method of claim 13, wherein the pressure is reduced substantially continuously.

17. A method of controlling a nitrogen concentration during the formation of an insulation layer, the method comprising:

exposing a substrate to a nitrogen-containing plasma ambient, said substrate having formed thereon an oxide layer of a first thickness;

monitoring the thickness of said oxide layer and generating a monitor signal indicating the monitored thickness; and controlling at least one process parameter which determines a nitrogen ion density of said plasma ambient on the basis of said monitor signal.

18. The method of claim 17, wherein said at least one process parameter is a pressure in said plasma ambient.

19. The method of claim 18, wherein said pressure is reduced when said monitor signal indicates an increase of said first thickness.

20. The method of claim 17, further comprising establishing a relationship between said monitor signal and values of said at least one process parameter.

21. The method of claim 17, further comprising estimating an amount of nitrogen incorporated into said oxide layer on the basis of said nitrogen ion density.

22. The method of claim 21, wherein said at least one process parameter is controlled on the basis of said estimated amount.

23. The method of claim 18, wherein an initial pressure of said plasma ambient is selected in accordance with said predefined thickness.

* * * * *